United States Patent
Tachibana

(10) Patent No.: US 10,632,506 B2
(45) Date of Patent: Apr. 28, 2020

(54) CLEANING METHOD AND CLEANING DEVICE USING MICRO/NANO-BUBBLES

(71) Applicant: SIGMA-TECHNOLOGY INC., Ibaraki (JP)

(72) Inventor: Yoshiaki Tachibana, Hitachinaka (JP)

(73) Assignee: SIGMA-TECHNOLOGY INC., Ibaraki (JP)

( * ) Notice: Subject to any disclaimer, the term of this patent is extended or adjusted under 35 U.S.C. 154(b) by 10 days.

(21) Appl. No.: 15/319,041

(22) PCT Filed: Dec. 1, 2015

(86) PCT No.: PCT/JP2015/083678
§ 371 (c)(1),
(2) Date: Dec. 15, 2016

(87) PCT Pub. No.: WO2016/088731
PCT Pub. Date: Jun. 9, 2016

(65) Prior Publication Data
US 2018/0161737 A1    Jun. 14, 2018

(30) Foreign Application Priority Data
Dec. 2, 2014   (JP) ................................. 2014-244538

(51) Int. Cl.
*B01F 1/00*    (2006.01)
*B01F 15/06*   (2006.01)
(Continued)

(52) U.S. Cl.
CPC ................. *B08B 3/02* (2013.01); *B01F 1/00* (2013.01); *B01F 1/0005* (2013.01); *B01F 3/04* (2013.01);
(Continued)

(58) Field of Classification Search
None
See application file for complete search history.

(56) References Cited

U.S. PATENT DOCUMENTS 5,665,200 A * 9/1997 Fujimoto ............ G03F 7/70691
156/345.18
2012/0312782 A1 * 12/2012 Tanaka ...................... C23F 1/08
216/92

(Continued)

FOREIGN PATENT DOCUMENTS

JP    2009129976    6/2009
JP    2009170709    7/2009
(Continued)

OTHER PUBLICATIONS

English Machine Translation of JP 2013-166143.*
(Continued)

*Primary Examiner* — Nicole Blan

(57) ABSTRACT

Provided are a cleaning method and cleaning device for cleaning with micro/nano-bubbles, with which a simple method of spraying a treatment solution containing micro/nano-bubbles onto a substrate to be processed makes it possible to efficiently and reliably peel off residual resist or remove contaminants from the substrate, while reducing an environmental load. This cleaning method is characterized in that, with respect to a substrate to be treated to which a resist film has adhered onto the substrate or a substrate to be treated to which the surface thereof has been contaminated with a metal or metal compounds, the resist film is peeled off or the metals or metal compounds are removed by spraying onto the substrate to be treated a treatment solution containing gaseous micro/nano-bubbles and having a temperature maintained at 30° C. to 90° C., the mean particle size of the micro/nano-bubbles when measured by an ice embedding method using a cryo-transmission electron microscope (Continued)

being 100 nm or smaller, preferably 30 nm or smaller, and also preferably the density of such bubbles being $10^8$ or more bubbles per 1 mL.

8 Claims, 11 Drawing Sheets

(51) Int. Cl.

| | | |
|---|---|---|
| *B01F 3/04* | (2006.01) | |
| *B01F 5/02* | (2006.01) | |
| *B05D 3/10* | (2006.01) | |
| *B05D 1/02* | (2006.01) | |
| *B08B 3/02* | (2006.01) | |
| *B08B 3/08* | (2006.01) | |
| *H01L 21/304* | (2006.01) | |
| *H01L 21/027* | (2006.01) | |
| *H01L 21/02* | (2006.01) | |
| *H01L 21/033* | (2006.01) | |
| *B05B 7/32* | (2006.01) | |
| *B05B 7/16* | (2006.01) | |

(52) U.S. Cl.
CPC ........... *B01F 3/04049* (2013.01); *B01F 5/02* (2013.01); *B01F 5/0231* (2013.01); *B01F 15/06* (2013.01); *B05B 7/16* (2013.01); *B05B 7/1666* (2013.01); *B05B 7/32* (2013.01); *B05D 1/02* (2013.01); *B05D 3/10* (2013.01); *B08B 3/08* (2013.01); *H01L 21/027* (2013.01); *H01L 21/02052* (2013.01); *H01L 21/0331* (2013.01); *H01L 21/304* (2013.01)

(56) References Cited

U.S. PATENT DOCUMENTS

| | | | |
|---|---|---|---|
| 2013/0204121 A1* | 8/2013 | Andresen | A61B 6/037 600/411 |
| 2014/0041694 A1 | 2/2014 | Miyazaki et al. | |

FOREIGN PATENT DOCUMENTS

| | | |
|---|---|---|
| JP | 2010238992 | 10/2010 |
| JP | 201188979 | 5/2011 |
| JP | 2011129743 | 6/2011 |
| JP | 5555892 | 8/2013 |
| JP | 2013146714 | 8/2013 |
| JP | 2013166143 A * | 8/2013 |
| JP | 2013532629 | 8/2013 |
| JP | 2014090031 | 5/2014 |
| KR | 1020120108673 A | 12/2012 |
| KR | 102014020775 A1 | 2/2014 |
| WO | 2012090815 | 7/2012 |

OTHER PUBLICATIONS

English Machine Translation of JP 2009-170709.*
English Machine Translation of WO 2012-090815.*
International Search Report received for PCT Patent Application No. PCT/JP2015/083678, dated Mar. 1, 2016, 5 pages.
Extended European Search Report received for European patent Application No. 15865774.2, dated Dec. 13, 2017, 12 pages.

* cited by examiner

Cross-section D-D

CLEANING METHOD AND CLEANING DEVICE USING MICRO/NANO-BUBBLES

CROSS-REFERENCE TO RELATED APPLICATIONS

This application is a national phase claiming the benefit of and priority to International Patent Application No. PCT/JP2015/083678, entitled "CLEANING METHOD AND CLEANING DEVICE USING MICRO/NANO-BUBBLES", filed Dec. 1, 2015, which claims priority to Japanese Patent Application No. 2014-244538, entitled "CLEANING METHOD AND CLEANING DEVICE USING MICRO/NANO-BUBBLES", filed Dec. 2, 2014, which are hereby incorporated by reference in their entireties.

TECHNICAL FIELD

The present invention relates to a cleaning method and a cleaning device for peeling off or removing contaminants on substrates such as glass substrates or semiconductor wafers, wherein the contaminants include residual resist films and metals or metal compounds adhered or formed on the substrates. The method and the device use a treatment solution that contains gaseous micro-nano bubbles having the mean particle size of 100 nm or less.

BACKGROUND TECHNOLOGY

As described in Non-Patent Literature 1, the features of micro-nano bubble typically include:
(a) bubble system is small,
(b) bubble rising speed is low,
(c) bubbles reduce frictional resistance,
(d) internal pressure of bubble is high,
(e) gas-liquid interface is large,
(f) amount of gas-dissolution is large,
(g) dissolution or shrinkage accompanies bubbles, and
(h) surface of bubble is negatively charged.

Because of these various features, application of micro-nano bubbles to a wide range of fields such as foods, cosmetics, pharmaceuticals, semiconductor cleaning, and plant growth are expected. As the particle size becomes small, the buoyancy of micro-nano bubbles become very smaller compared to the viscous force. They can exist in a liquid remaining still in a form of ultra-fine bubbles for a long period of time without coming to the surface. Further, liquids containing nano bubbles of very small size are known to become transparent since such tiny bubbles are invisible.

Methods of generating micro-nano bubbles are classified roughly into two. One is to allow gas to accompany liquid by being fluidized in the liquid; the other is to blow gas into liquid in a stationary state. More specifically, as described in Non-Patent Literature 1, various micro-nano bubble generation methods have been proposed, the methods include a liquid swirling flow type, a static mixer type, a ventury type, a pressurized dissolution type, and a fine-pore type.

As stated above, the micro-nano bubble has such features as were not known in the conventional knowledge. In recent years, it has been studied to apply the micro-nano bubble to a cleaning method for peeling off or removing contaminants on substrates such as glass substrates or semiconductor wafers, wherein the contaminants include residual resist films and metals or metal compounds adhered or formed on the substrates (See Patent Literature 1, for example.) In the invention described in Patent Literature 1, at a first peeling-off process, a first stripping solution L1 having nano bubbles mixed therein is heated at a low temperature of about 40 to 60° C. and is supplied to the substrate at a condition that nano bubbles in the solution do not collapse so as to maintain high permeability to the resist film; then, at a second peeling-off process, the resist film is peeled off by the collapsing of the nano bubbles contained in the first stripping solution L1 using the pressure of a second stripping solution L2 given with a high-pressure pump.

Further, as an alternative to a lift-off method or an etching process of a resist film to be performed in order to peel off the metal film on the resist when manufacturing semiconductor devices, a method of jetting pure water containing ozone micro bubbles or micro-nano bubbles against a substrate has been proposed (see Patent Literatures 2 and 3.) Besides these, the inventors of the present invention have developed a new method of generating micro-nano bubbles in large quantities and an apparatus therefor. The developed new method and the apparatus are capable of generating micro-nano bubbles efficiently in quantity by the water hammering that is produced by pressurizing a gas-liquid mixture by high-pressure sending. In Patent Literature 4, the inventors of the present invention have proposed an application of this technique to a clean washing for such as semiconductor wafers.

RELATED ART

Patent Literature

Patent Literature 1: Japanese Patent Application Laid-Open No. 2009-129976
Patent Literature 2: Japanese Patent Application Laid-Open No. 2010-238992
Patent Literature 3: Japanese Patent Application Laid-Open No. 2014-90031
Patent Literature 4: Japanese Patent No. 5555892

Non-Patent Literature

Non-patent Literature 1: Hideki Tsuge, "The basis of micro-bubble-nano bubble", Bull. Soc. Sea Water Sci., Jpn., 2010, Vol. 64, pp. 4-10.

SUMMARY OF THE INVENTION

Problems to be Solved by the Invention

Conventionally, in the cleaning of glass substrates or a semiconductor substrates, or the likes, a method for removing contaminants at a high temperature of 100° C. or higher by using a stripping solution that contains an alkaline aqueous solution or an organic solvent, has been employed. From the viewpoint of reducing the load on the environment, energy saving, and safety, a strongly desired cleaning method is a method that is able to perform the cleaning processing at relatively low temperatures of lower than 100° C. using pure water. In that sense, a method for performing washing with a treatment solution containing gaseous micro-nano bubbles is considered effective.

The method of peeling off a resist film, the method being described in Patent Literature 1, needs to undergo two process steps comprised of a first peeling-off step and a second peeling-off step. In some cases, a rinsing step is provided for removing the resist film, which makes the peeling-off process complicated. With respect to nano bubbles contained in the stripping solution L1 used in the first peeling-off step, Patent Literature 1 mentioned above does not concretely describe the method of generating bubbles and the size and density thereof. It is therefore considered that adoption of only the first peeling-off step is difficult for obtaining a sufficient peeling-off effect.

Pure water containing ozone micro-nano bubbles disclosed in Patent Literatures 2 and 3 is intended to be used in a lift-off method or an etching method; this pure water is considered also usable for the cleaning. However, Patent Literature 2 discloses merely a water mixed with micro bubbles as a stripping solution; the literature does not provide any specific description or suggestion for use of nano bubbles. Further, in the etching method described in Patent Literature 3, the size of micro-nano bubbles used is 0.01 to 50 μm and its density is 1000 or more but 100,000 or less per 1 mL. In addition, the temperature of micro-nano bubbles described is merely to be higher than 15° C. but lower than 50° C.

However, a study by the inventors of the present invention have found that, when the size of micro bubbles contained in the stripping solution is 1 μm or larger, the stripping solution does not show satisfactory effect on peeling off residual resist films on a substrate or on removing contaminants of metal or metal compound on a substrate. They further have found that the effect on peeling off or removal is greatly affected by the density of the bubbles contained in the treatment solution; and that, if the density is low, a satisfactory effect on peeling-off or removal is not attained even when nano bubbles are used.

In addition, also in Patent Literature 4, sufficient studies has not been conducted on the properties and characteristics of bubbles and the using conditions of the treatment solution which are required for obtaining a great effect upon peeling off residual resist films on a substrate or upon removing contaminants of metal or metal compound formed or stuck on a substrate. Thus, a cleaning method of peeling off residual resist films or removing contaminants of metal or metal compound efficiently in a simple and easy manner and a suitable device therefor, while using a stripping solution having a small environmental load reduced as much as possible, are strongly desired.

The present invention was made in view of the conventional problems described above. The invention intends to provide a cleaning method and cleaning device for cleaning using micro-nano bubbles. The provided method is capable of peeling off residual resist or removing contaminants of metal or metal compound on a substrate more efficiently and reliably than the conventional technique, by a simple method of spraying a treatment solution containing micro-nano bubbles onto a workpiece substrate, while reducing environmental load. In the invention, the mean particle size of the micro-nano bubble to be contained in a stripping solution such as pure water is defined including the density of the micro-nano bubbles as a preferable parameter; and the optimum temperature of the stripping solution is also defined.

Means for Solving Problems

The inventors of the present invention have found that the following conditions can solve the above-stated problems. The conditions comprise reducing the mean particle size of micro-nano bubbles contained in the stripping solution such as pure water to a nano level; further, preferably, defining the density of the micro-nano bubbles in the high-density direction; and setting the temperature of the stripping solution to an elevated temperature as close as possible to 100° C., the boiling point of pure water. Being led by these findings, the present invention has been made.

That is, the configuration of the present invention is as follows.

[1] The present invention provides a cleaning method that uses micro-nano bubbles for peeling off resist films or removing contaminants of metal or metal compound on a workpiece substrate by spraying a treatment solution against the workpiece substrate, wherein the treatment solution contains gaseous micro-nano bubbles having a mean particle size of 100 nm or less when determined by a measurement with a cryo-transmission electron microscopy using the ice embedding method, and wherein the treatment solution is maintained at a temperature of 30 to 90° C.

[2] The present invention provides a cleaning method that uses micro-nano bubbles according to item [1] above, wherein the gaseous micro-nano bubbles having a mean particle size of 30 nm or less when determined by the measurement with the cryo-transmission electron microscopy using the ice embedding method.

[3] The present invention provides a cleaning method that uses micro-nano bubbles according to item [1] or item [2] above, wherein the density of the gaseous micro-nano bubbles contained in the treatment solution is $10^8$ or more per 1 mL when determined by the measurement with the cryo-transmission electron microscopy using the ice embedding method.

[4] The present invention provides
a cleaning method that uses micro-nano bubbles according to any one of items [1] to [3] above,
wherein the treatment solution containing gaseous micro-nano bubbles is a treatment solution that contains gaseous micro-nano bubbles produced by collision of jets of a solution containing dissolved gas,
wherein the collision is made to occur at the center of a cylinder
by injecting a solution containing dissolved-gas from the outside of the cylinder having two or more small through-holes arranged in the circumferential direction of the cylinder
so as to jet the injected solution from openings of the small through-holes in the cylinder at a pressure higher than the atmospheric pressure,
wherein the openings of the small through-holes are arranged facing each other on the same plane parallel to the radial cross section of the cylinder in order that the water hammer of the jets concentrates at the center of the cylinder by making the collision to occur among jets from each of the openings.

[5] The present invention provides a cleaning method that uses micro-nano bubbles according to any one of items [1] to [4] above, wherein the gas is a gas selected from the group consisting of ozone and oxygen; and the treatment solution is pure water containing gaseous micro-nano bubbles selected from the group consisting of ozone and oxygen.

[6] The present invention provides a cleaning method that uses micro-nano bubbles according to any one of items [1] to [5] above, wherein the gas is a gas that includes at least one of gases selected from the group consisting of carbon dioxide and hydrogen peroxide in addition to ozone or oxygen.

[7] The present invention provides a cleaning method that uses micro-nano bubbles according to any one of items [1] to [6] above, wherein water droplets and moisture on the non-processed substrate are dried before spraying the treatment solution.

[8] The present invention provides a cleaning method that uses micro-nano bubbles according to any one of items [1] to [7] above, wherein the treatment solution that contains gaseous micro-nano bubbles is sprayed against the workpiece substrate as the cleaning object applying ultrasonic vibration thereon.

[9] The present invention provides a cleaning method that uses micro-nano bubbles according to any one of items [1] to [7] above, wherein a voltage is applied between the workpiece substrate and an electrode disposed close to a nozzle header that sprays the treatment solution.

[10] The present invention provides a cleaning method that uses micro-nano bubbles according to any one of items [1] to [9] above, wherein the temperature of the treatment solution is more than 50° C. but 85° C. or lower.

[11] The present invention provides
a cleaning device that uses micro-nano bubbles, the cleaning device comprising:
  means for sucking gas and liquid;
  means for pressurizing simultaneously the gas and the liquid and delivering the same;
  a gas-liquid mixing tank for mixing the delivered liquid containing gas with fresh gas to enrich dissolved gas;
  means for heating a treatment solution that contains gaseous micro-nano bubbles to a temperature of 30 to 90° C.;
  a micro-nano bubble generating device comprising
  an injection nozzle for generating micro-nano bubbles using the gas-dissolved liquid heated by the heating device,
    wherein the injection nozzle comprises
    a hollow cylinder having two or more small through-holes therein arranged in the peripheral direction thereof,
    wherein the small through-holes are arranged
    so that each of openings of the through-holes faces to the other opening on the same plane parallel to the redial cross section of the hollow cylinder,
    further so that all the extension lines passing through the cross-sectional center of the small through-holes intersect at the center of the hollow cylinder,
    and
    a micro-nano bubble discharge port provided on at least one end of the hollow cylinder;
  a nozzle header connected to the injection nozzle to spray the treatment solution containing gaseous micro-nano bubbles against a workpiece substrate having a resist film or a contaminant of metal or of metal compound thereon;
  and
  a holder disposed facing the nozzle header to support the workpiece substrate.

[12] The present invention provides a cleaning device that uses micro-nano bubbles according to the item [11] above, wherein the heating device is a heating device provided for heating the dissolved solution in the gas-liquid mixture state immediately after delivered from the gas-liquid mixing tank.

[13] The present invention provides a cleaning device that uses micro-nano bubbles according to the item [12] above, wherein the heating device is provided as a heater at least in one location of the bottom and side of the gas-liquid mixing tank.

[14] The present invention provides a cleaning device that uses micro-nano bubbles according to any one of items [11] to [13] above, further comprising a drying means for drying water droplets and moisture on the non-processed substrate.

[15] The present invention provides a cleaning device that uses micro-nano bubbles according to any one of items [11] to [14] above, wherein the holder is connected to an ultrasonic generator capable of applying ultrasonic vibration on the workpiece substrate.

[16] The present invention provides a cleaning device that uses micro-nano bubbles according to any one of items [11] to [14] above, further comprising a voltage applying device for applying a voltage between the holder to support the non-processed substrate and an electrode to be placed close to the nozzle header for spraying the treatment solution.

[17] The present invention provides a cleaning device that uses micro-nano bubbles according to any one of items [11] to [16] above, further comprising a heating device or a warm-air generator for heating at least one of the nozzle header and the holder.

[18] The present invention provides a cleaning device that uses micro-nano bubbles according to any one of items [11] to [17] above, further comprising an air conditioner, wherein the nozzle header and the holder are surrounded within one compartment and the air conditioner controls the temperature of the inside of the compartment to 30 to 90° C.

[19] The present invention provides a cleaning device that uses micro-nano bubbles according to any one of items [11]-[18] above, wherein the heating temperature is 50 to 85° C.

Advantageous Effects of the Invention

Cleaning method by the present invention is capable of peeling off the residual adhered resist or removing contaminants of metals or metal compounds on a substrate more efficiently and reliably than the conventional method, while reducing the environmental load. Furthermore, the invented method is able to improve the cleaning effect more, by applying ultrasonic vibration or voltage when drying the workpiece substrate or spraying the treatment solution containing gaseous micro-nano bubbles against the workpiece substrate.

The cleaning device by the present invention can be constructed in a simple and compact configuration merely by combining the conventional micro-nano bubble generator with the heating device for heating gaseous micro-nano bubbles, the nozzle header having the injection nozzle, and the holder for supporting a workpiece substrate. Further, simply adding to this device configuration a drying means, an ultrasonic generator, or a voltage applying means can shorten the cleaning time and improve the cleaning efficiency.

MODES FOR IMPLEMENTING THE INVENTION

Figure 1A:
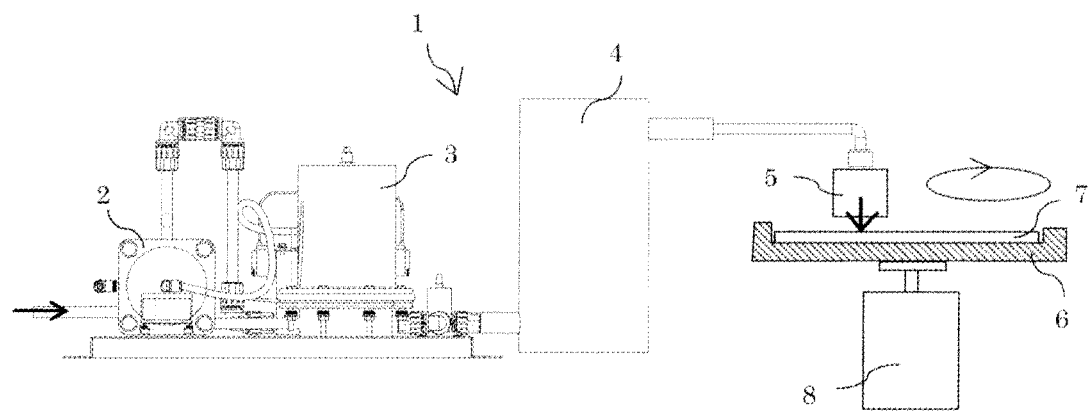
FIGS. 1A and 1B are a front view and a perspective view of an example of the cleaning device of the present invention that uses micro-nano bubbles, respectively.

Generation amount of gaseous micro-nano bubbles is dependent on the dissolved amount of gas contained in the treatment solution for cleaning. Therefore the amount tends to decrease when the temperature of the treatment solution becomes high, because the solubility constant of gas to liquid reduces as the temperature rises. Because of this, gaseous micro-nano bubbles when used at high temperatures are believed to lower the cleaning power, thus the micro-nano bubbles of gas were not used until now. As Patent Literature 3 has mentioned that the temperature of micro-nano bubbles is to be 15° C. or higher but 50° C. or lower, it was a common practice to use a solution containing gaseous micro-nano bubbles at lower temperatures. Patent Literature 1 has further mentioned that the stripping solution L1 prepared by mixing nano bubbles is heated to a low temperature of about 40 to 60° C. as the first peeling-off step have been described. The purpose of this heating should be interpreted as maintaining a high permeability to the resist film in a nano bubble state. This heating is not suitable for such a method in which the treatment solution containing gaseous nano bubbles is sprayed directly against a workpiece substrate for peeling off the resist.

In contrast, the present invention has been made on the basis of a finding obtained through detailed examination, conducted outside the conventional common knowledge, on the nature and characteristics of the best of micro-nano bubbles for cleaning and the related processing method. The finding is that spraying directly the treatment solution containing gaseous micro-nano bubbles against a workpiece substrate with the solution being at high temperature, taking the advantage of the fact that the particle size of gaseous micro-nano bubbles is smaller than that of the conventional bubbles, is capable of peeling off the residual resist film and removing contaminants of metal or metal compound efficiently and reliably in a shorter time than that in the conventional method.

The size of the micro-nano bubble contained in the treatment solution used in the present invention can be defined by the mean particle size. The smaller the mean particle size is, the more quantities of bubbles in nano-level are contained and there is a tendency that the quantity of bubbles of the micro-order can be reduced. The size of the micro-nano bubble is affected also by the particle size distribution (the standard deviation of particle sizes), but the effect is small. The micro-nano bubbles contained in the treatment solution are of the order of nano level in terms of the mean particle size; it is necessary to make the mean particle size being as small as possible.

In the present invention, the mean particle size of the micro-nano bubbles of gas is 100 nm or less and preferably 30 nm or less when determined by a measurement with a cryo-transmission electron microscopy using the ice embedding method. When the mean particle size of micro-nano bubbles is 100 nm or less, spraying the stripping solution in a state heated to a high temperature enables the peeling off of the residual resist film and the removing of contaminants of metal or metal compound to perform in a short time at a higher rate. Further, if the mean particle size is 30 nm or less, it is possible to obtain a significantly great effect.

As a measuring method of the particle size of micro-nano bubbles, various methods are known in conventional arts. From among them, the following techniques have been proposed because the measuring of nano bubbles by an optical observation is difficult. The proposed techniques include, for example, the light scattering method utilizing Mie scattering light, the laser diffraction-scattering method, the nano particles tracking analysis method that observes Brownian movement of the bubble particles in a liquid, the aperture electrical resistance method (Coulter counter principle), the dynamic light scattering, and the resonance mass measurement method that utilizes a beam of Micro Electro-Mechanical Systems (MEMS). In addition to these techniques, also proposed are a method of determination of particle size of nano bubbles by the zeta potential measurement and a method of confirmation of the presence of nano bubbles with the electron spin resonance (ESR) using a spin trapping agent.

The present invention proposes, as a micro-nano bubble measurement technique other than the above, a method of measuring with a cryo-transmission electron microscopy using the ice embedding method (see Japanese Patent Application No. 2014-230407). This method is able to observe and analyze directly the ultra-fine bubbles in a liquid and their distribution with their image, in which the liquid is brought to the solid state of amorphous and then ultra-fine bubbles contained in the liquid in the solid state of amorphous is observed using a transmission electron microscope. Therefore, this method is capable of measuring ultra-fine bubbles having a particle size of less than 10 μm with high accuracy. The mean particle size of the gaseous micro-nano bubbles, as defined in the present invention, are those obtained by measuring in this way.

The method of measuring with a cryo-transmission electron microscope using the ice embedding method uses a specimen of liquid held on a micro-grid or a micro-mesh; the measurement is conducted with a transmission electron microscope having energy of 10 to 300 kilo-electron volts (keV) with a setting of 1 to $10^5$ electron/Å$^2$ in the number of electron beams.

Temperature of the treatment solution used in the present invention needs to be optimized within the range between the room temperature or higher but below 100° C. from the viewpoint of the cleaning effect of peeling off or removing, the handling of the cleaning object during the cleaning process, the temperature control, the capacity and durability of the cleaning device, the energy conservation, the environmental load, and the safety. Particularly in the present invention, it is preferred to use pure water as the treatment solution in order to reduce the load on the environment. Thus, the temperature of the treatment solution should be set within a range of 30 to 90° C., below the boiling point of water, preferably within the range of 50 to 85° C. When the treatment system temperature is lower than 30° C., the processing time tends to lengthen even if a treatment solution containing gaseous micro-nano bubbles having a mean particle size of 100 nm or less is used; thus the effect of the present invention cannot be sufficiently obtained under such temperature. The treatment solution heated to a higher temperature can peel off the residual resist films or remove the contaminants of metal or metal compound efficiently in a short time. If the temperature exceeds 90° C. however, the temperature control becomes difficult. In addition, where the temperature is in excess of 90° C., the peeling off or removal effect tends only to saturate due to the volatilization of the treatment solution and the consequent increase in the release rate of the micro-nano bubbles. Therefore, the advantage of making the temperature of the treatment solution higher is lost. When the temperature of the treatment solution is set within the range of 50 to 85° C., a high cleaning effect can be stably obtained.

In the present invention, a high effect of cleaning can be achieved by defining not only the mean particle size of the micro-nano bubbles but also the number of the bubbles contained in one milliliter of the treatment solution, i.e., the density of the micro-nano bubble, to a high value. The density of the micro-nano bubble contained in the treatment solution used in the present invention is required to be such a density as has $10^8$ or more micro-nano bubbles per one milliliter of the treatment solution when determined by a measurement with the cryo-transmission electron microscope using the ice embedding method. The density is preferably to be $10^{12}$ bubble/mL or more, more preferably $10^{16}$ bubble/mL or more. Micro-nano bubble to be used in the present invention is primarily very small in the mean particle size. Therefore, if its density is less than $10^8$ bubbles, the concentration of the gas included in the bubble becomes thinner. This prevents the peeling off of the residual resist film or the removing of the contaminants of metal or metal compound from acceptable cleaning performance. For example, when using zone, which has a powerful cleaning effect, the higher the ozone concentration is, the stronger the cleaning effect is obtained. In contrast, if the density of the micro-nano bubble is $10^8$ bubbles or less, the ozone concentration in the treatment solution becomes low; therefore the cleaning effect is limited.

In terms of the combination of the micro-nano bubble of gas and the treatment solution to be used in the present invention, the gas is ozone or oxygen and the treatment solution is preferably pure water containing micro-nano bubbles of ozone or oxygen. The combination of ozone with pure water or oxygen with pure water can realize both reduction of environmental load and simplification of the cleaning process with increased efficiency; thereby an enhanced cleaning effect can be obtained. Among these, the ozone micro-nano bubble formed by combining ozone with pure water is more preferable, because this combination improves the cleaning effect more than others.

The gas in the micro-nano bubbles used in the present invention is at least ozone or oxygen, and preferably the gas should further include at least one of carbon dioxide and hydrogen peroxide. For example, the treatment solution containing such gas as ozone or oxygen, and carbon dioxide is able to clean more efficiently by guiding the ozone or oxygen into the cleaning object and by the acidification effect of carbon dioxide, such behavior being caused by the adsorption of carbon dioxide by adhered matters or contaminants on the workpiece substrate. Further, when ozone or oxygen, and hydrogen peroxide are contained, hydroxyl radical (OH.) may be produced by reaction of oxygen or ozone with hydrogen peroxide; in this event, the strong oxidizing power of this hydroxyl radical may be utilized. Among these, it has been found that gaseous micro-nano bubbles produced combining ozone with carbon dioxide provides, in particular, not only an easy handling but also a significantly great effect compared to the conventional methods.

As described above, the method for cleaning by the present invention can enhance the cleaning effect by the spraying of the treatment solution containing gaseous micro-nano bubbles. In addition, combination of those three methods described below can increase the cleaning speed, shorten the cleaning time, and improve significantly the washing efficiency.

As the first method, it is preferable to employ a step of drying water droplets and moisture on the non-processed substrate before spraying the treatment solution containing gaseous micro-nano bubbles. If water droplets and moisture on said untreated substrate remain on the non-processed substrate, such remaining matters decrease the cleaning effect, because the remaining water lowers the density of the gaseous micro-nano bubble contained in the sprayed treatment solution. It is known that a micro-nano bubble has the zeta potential on the particle surface and its periphery is surrounded by a negative charge of $OH^-$. Although the details are unknown, the $OH^-$ is considered to be a component that promotes decomposition and removal of various deposits or contaminants on the workpiece substrate, via various reactions. However, the water remaining on the non-processed substrate is considered to be a component that weakens the cleaning action that uses the $OH^-$ ions; the water works as a barrier against the action of the $OH^-$ ions when the $OH^-$ ions approach the deposits or contaminants to act thereon. Consequently, the cleaning effect can be improved by eliminating obstructions to effects of the gaseous micro-nano bubble as much as possible, when employing a process of drying the water droplets and moisture on the non-processed substrate.

Above-stated drying process can be carried out using a drying means for example: a spin dryer used usually in the washing process of semiconductor wafers, an isopropanol (IPA) vapor drying apparatus, and a spin-etcher. The spin dryer is a rotary drying device, which dries the workpiece substrate by draining cleanly water using centrifugal force of rotation and flow of clean air sucked through a filter such as the ultra-low penetration air (ULPA) filter. When the drying process is intended to be simplified, the following method is employable for that purpose. In the method, water droplets and moisture are removed, in advance of the spraying of gaseous micro-nano bubbles, by the centrifugal force generated by rotating the workpiece substrate mounted on the holder at a high-speed. In this method, it may be applicable to blow dry air or hot air (nitrogen gas, an inert gas, may be used instead of air) over the workpiece substrate under the high-speed rotation to remove water droplets and moisture. Furthermore, to speed up drying the water droplets and moisture, a highly volatile liquid or water containing a volatile liquid such as alcohol may be sprayed on the workpiece substrate. These drying steps may be incorporated as one step of processing in a series of processing steps built as the cleaning method of the present invention; the drying step may be separately performed in a batch style alternatively.

In the present invention, the second method for increasing the cleaning effect is to apply ultrasonic vibration on the substrate used as an object of cleaning. This method gains a great effect in peeling off residual resist films or removing contaminants of metal or metallic compound from the substrate. The mechanism for obtaining the effect is not known in detail; it is however thought that the ultrasonic vibration might have such a function as helps the micro-nano bubbles to collapse uniformly, which is hard to occur since the micro-nano bubbles contained in the treatment solution is fine in particle size. This collapse can promote the release of gas, which is ozone for example, existing in the micro-nano bubbles. That is, in the cleaning method of the present invention, even if the treatment solution is maintained at a temperature of 30 to 90° C., preferably at a high temperature of 50 to 85° C., the micro-nano bubbles stay in the treatment solution because of the particle size being ultrafine. It is believed that the great contribution to the cleaning effect is brought by applying the ultrasonic vibration when the micro-nano bubble is sprayed on the workpiece substrate, because the releasing of the gas contained in the micro-nano bubble occurs uniformly even in a small space or a fine interstice by the ultrasonic vibration.

As long as the vibration frequency at the applying of the ultrasonic vibration is 10 kHz to 3 MHz, the effect of the present invention can be achieved to an acceptable degree. It is however preferable the vibration frequency is to be 10 kHz to 1 MHz, because the workpiece substrate might sometimes have chippings, cracks, or damages causing an adverse effect if the vibration frequency is high.

Further, as the third method for increasing the cleaning effect, it has been found that the applying of a voltage between the workpiece substrate and the electrode to be provided close to the nozzle header for spraying the treatment solution can bring a great effect with respect to the peeling off of the residual resist film or the removing of contaminants of metal or metal compound from the workpiece substrate. In this method, an electrode is provided close to the nozzle header for spraying the treatment solution and DC voltage or pulse voltage is applied continuously between the electrode and the workpiece substrate using a DC power supply or a pulsed power supply or the like, and under such condition the micro-nano bubbles is sprayed to the workpiece substrate. This method has been worked out on the basis of a new finding such that the applying of voltage plays a synergistic role in enhancing the cleaning effect. Since the micro-nano bubbles contained in the treatment solution has $OH^-$ ions on the surface, it is probable to promote the collapsing of the micro-nano bubbles that are less breakable because of their particle size being fine according to a phenomenon similar to electrolysis caused by applying voltage. Thus, it is believed that the releasing of the gas present in the micro-nano bubble, such as ozone and carbon dioxide for example, would be promoted; but the details are however unknown.

When using this third method, the applying of the voltage between the holder and the electrode located close to the nozzle header using a holder that supports the non-processed substrate, rather than the applying of voltage directly on the workpiece substrate, makes the operation easy, and to do so is a practical way in terms of safety. As the voltage to be applied, it is preferred to use a pulse voltage than a DC voltage by reason that a high voltage can be easily obtained and its energy efficiency is high.

As described above, when the semiconductor wafer after circuit pattern forming is used as the processed substrate in the cleaning using gaseous micro-nano bubbles applying a voltage, the applying of voltage might adversely affect; that is, electrical malfunction might be caused in the semiconductor element formed on such wafer. In that case, a method that reduces the adverse effects attributable to the voltage applied on the wafer may be employed; for example, it may be a feasible method to continuously emit such ions as cancel the charge from the reverse side of the workpiece substrate using an ionizer generator or similar apparatus. On the other hand, where this method is applied to cleaning a wafer of before circuit pattern forming, it is not necessary to consider such an adverse effect; a very great cleaning effect is obtained.

In the present invention, a uniform cleaning is achieved by spraying the treatment solution to the object of cleaning, the workpiece substrate, at a temperature of 30 to 90° C. preferably 50 to 85° C., with the workpiece substrate being rotated.

The next describes, referring to drawings, cleaning devices for implementing the cleaning method of the present invention.

Figure 1B:
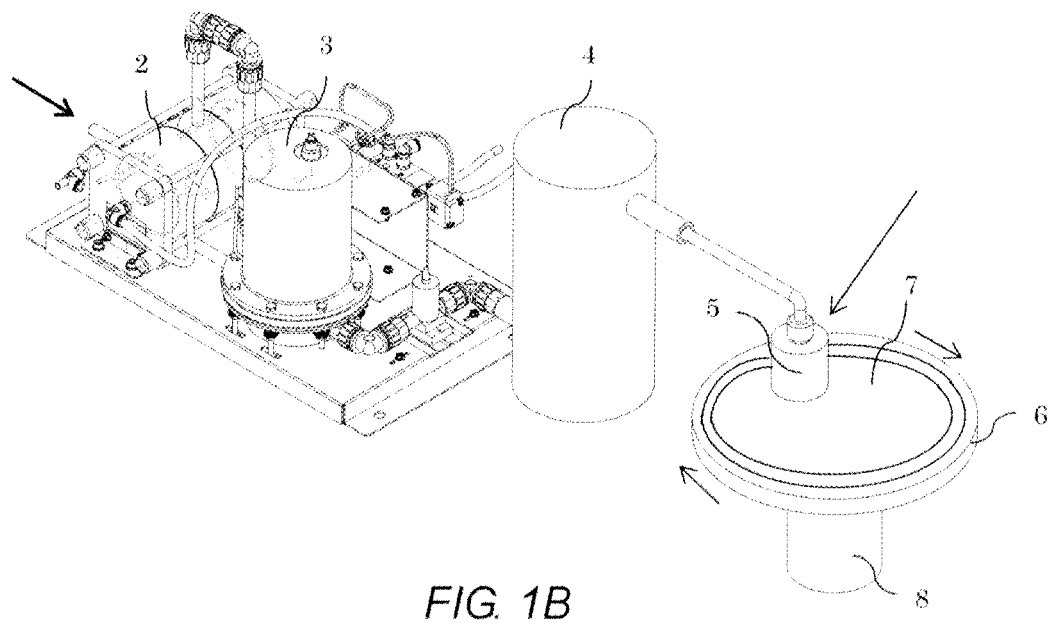

FIG. 1 is a diagram illustrating an example of the cleaning device using the micro-nano bubble of the present invention. FIGS. 1A and 1B are a front view and a perspective view of the cleaning device respectively. The cleaning device 1 illustrated in FIGS. 1A and 1B comprises a bellows pump 2, a gas-liquid mixing tank 3, a heating device 4, a micro-nano bubble means that has a micro-nano bubble generating nozzle, which is not illustrated, and a nozzle header 5 having an injection nozzle that injects a treatment solution containing gaseous micro-nano bubbles, wherein the injection nozzle is not illustrated. The treatment solution heated by the heating device 4 is sprayed from the nozzle header 5 against a workpiece substrate 7 supported by a holder 6 to generate micro-nano bubbles to clean. The holder 6 supporting the workpiece substrate 7 also serves as a rotating table having a rotating mechanism. Further, the holder 6 is connected to an ultrasonic generator 8 and has a mechanism that is capable of applying ultrasonic wave on the workpiece substrate 7 if necessary.

Figure 2A:
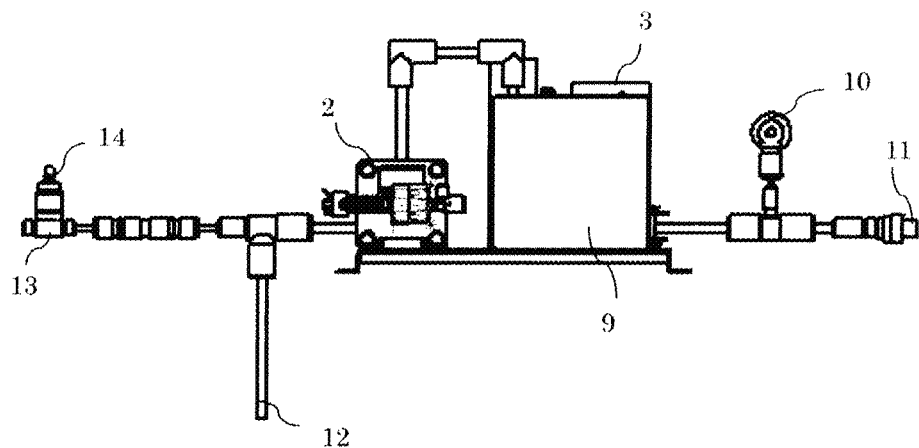
FIGS. 2A and 2B are a front view and a perspective view of a micro-nano bubble generator equipped in the cleaning device illustrated in FIG. 1, respectively.
Figure 2B:
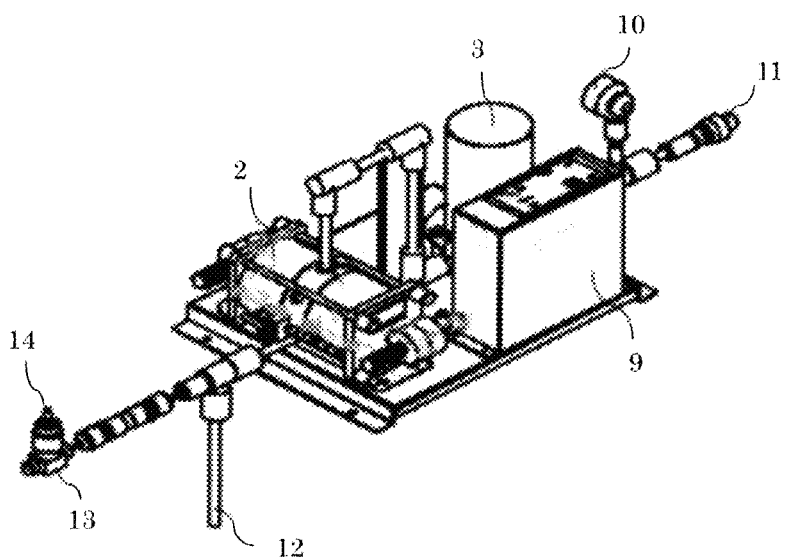

FIG. 2 illustrates a device configuration of the extracted micro-nano bubble generator portion equipped in the cleaning device illustrated in FIG. 1. FIGS. 2A and 2B are a front view and a perspective view of a micro-nano bubble generator respectively. In FIG. 2, reference numeral 2 designates the bellows cylinder pump, reference numeral 9 a pump controller, reference numeral 3 the gas-liquid mixing tank, reference numeral 10 a pressure sensor, reference numeral 11 a micro-nano bubble generating nozzle coupling portion, reference numeral 12 a liquid suction pipe, reference numeral 13 a gas suction port, and reference numeral 14 a gas suction regulator valve.

They are arranged as illustrated in the perspective view illustrated in FIG. 2B. Using the bellows cylinder pump 2, of which wetted part is made of fluorine resin, a liquid and a gas are sucked in the pump in a mixed state through the liquid suction pipe 12 and the gas suction regulator valve 14 with the gas volume is regulated. Then, they are agitated in the bellows to dissolve the gas and are compressed to make the liquid have the dissolved gas. In the present invention, a bellows cylinder pump 2 should only be a metal-free construction. At least one of the below-listed plastics may be used other than fluorine resin. Such plastic includes, for example, a general-purpose grade plastic such as polyethylene, polypropylene, and polyethylene terephthalate; an engineering plastic such as polyacetal, polyamide, polycarbonate, and denatured polyphenylene ether; and a super-engineering plastic such as polyether sulfone, polyphenylene sulfide, polyether ether ketone, and liquid crystal polymer. In that case, use of such various plastic including fluorine resin on not only the pump but also the wetted part can construct a highly reliable and clean micro-nano bubble generator. Further, in the present invention, where it is not required to clean and sterilize by a strict application of the metal-free construction, metals and ceramics may be used other than the above-mentioned plastics.

Next, the gas and the liquid are agitated by the pump 2 and pressure-transferred to the gas-liquid mixing tank 3. The pump 2 employs mainly a compressed-air driven type bellows-cylinder pump but an electric motor driven type may be used. The gas and the liquid in the gas-liquid mixing tank 3 are under the pressure given by the pump 2, thus the gas dissolves easily into the liquid. That is, the pressure of the pressure-transferring of the gas and the liquid from the pump 2 is checked by the pressure sensor 10. With this method, a preparation is performed for increasing the generation amount of micro-nano bubbles by enlarging the amount of dissolved gas. In the micro-nano bubble generating system of the present invention, it is practical to use a bellows cylinder pump as the pump 2. Depending on the application however, pumps conventionally known as liquid transferring pumps typically listed below are employable. They include a reciprocating pump such as a piston pump, a plunger pump, or a diaphragm pump; and a rotary pump such as a gear pump, an eccentric pump, a screw pump, a cascade pump, and a vane pump.

Liquid entering the gas-liquid mixing tank 3 by the pressure-transferring is mixed with gas to have the gas dissolve in the liquid, and then transferred to the micro-nano bubble generating nozzle coupling portion 11. The micro-nano bubble generating nozzle coupling portion 11 is a part that connects to a nozzle for generating micro-nano bubbles having a size of 100 μm or less, preferably 30 μm, in a large quantities from the dissolved gas.

While such transferring, the variation of pressure between the nozzle coupling portion 11 and the gas-liquid mixing tank 3 is monitored to watch the progress of dissolving state of the gas and the liquid. With this, a stable and constant pressure state needed for the micro-nano bubble generation nozzles is achieved.

Steps which are carried out using the micro-nano bubble generation apparatus of the present invention illustrated in FIGS. 2A and 2B are as follows. The step that is performed using the liquid suction pipe 12, the gas suction port 13, and the gas suction regulator valve 14 is the gas-liquid suction process. The pressure is regulated by the pressure sensor 10. Next, pressurizing the gas-containing liquid using bellows cylinder pump 2 is the gas-liquid pressurization process. Following that process, the pressurized gas-containing liquid is mixed with a fresh gas; this process is the dissolved gas enriching process performed using a pump controller 9 and the gas-liquid mixing tank 3. Thereafter, the micro-nano bubble is generated after connecting a generating nozzle, which will be described later, of the present invention to the micro-nano bubble generating nozzle coupling portion 11. This process is referred to as the dissolved gas micronizing process; the micro-nano bubble is generated by injecting the gas-containing liquid from the outside of a cylinder having two or more small through-holes through such small through-holes at a pressure higher than the atmospheric pressure so as to cause the jets to collide at one point inside the cylinder.

Figure 3A:
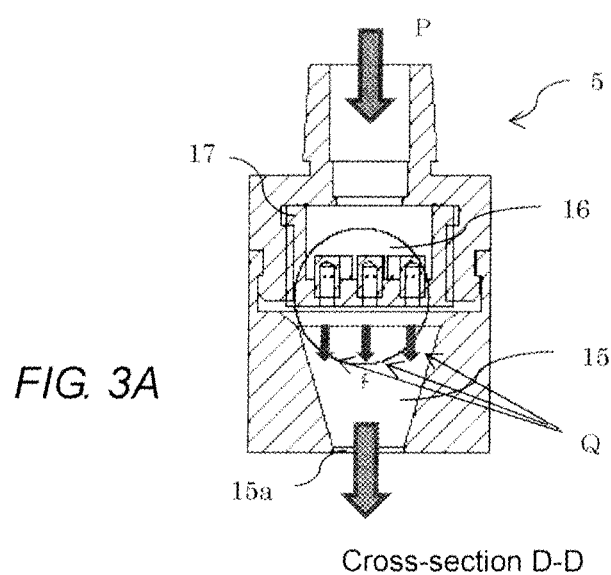
FIGS. 3A and 3B illustrate an example of the shape of the nozzle that generates gaseous micro-nano bubbles and an example of the nozzle header that sprays the treatment solution and equipped in the cleaning device illustrated in FIG. 1, respectively.
Figure 3B:
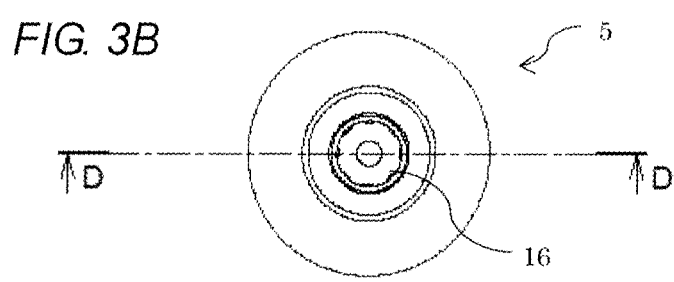

FIGS. 3A and 3B illustrate an example of the shape of the nozzle and the nozzle header in the cleaning device illustrated in FIG. 1 respectively, wherein the nozzle generates micro-nano bubbles of gas and the nozzle header sprays the treatment solution. FIG. 3A is a cross-sectional view of the nozzle header 5 and FIG. 3B is a top view of the same. FIG. 3A is a cross-sectional view of FIG. 3B taken along the line D-D.

As illustrated in FIGS. 3A and 3B, the nozzle header 5 is comprised of a spraying nozzle 15 for spraying the treatment solution, a liquid collision nozzle 16 used as a micro-nano bubble discharge nozzle, and a base 17. One or two or more number of the liquid collision nozzles 16 are installed on the base 17. In the figure, the liquid collision nozzle 16 illustrated is an example of the shape of a nozzle for generating micro-nano bubbles of gas. The treatment solution (Q) jetted from the liquid collision nozzle 16 is sprayed from a spraying port 15a of the spraying nozzle 15 toward the workpiece substrate 7 to perform cleaning. In the present invention, the temperature of the treatment solution is regulated at 30 to 90° C., preferably 50 to 85° C. This temperature control is to be applied over the treatment solution preferably in the area where the treatment solution passes through the nozzle header 5. This preference comes from the fact that the correlation between the cleaning capacity and the temperature of the treatment solution passing through the nozzle header 5 is good. Therefore, it is preferable that the nozzle header 5 should have a temperature sensor for measuring the temperature of the treatment solution.

Figure 4:
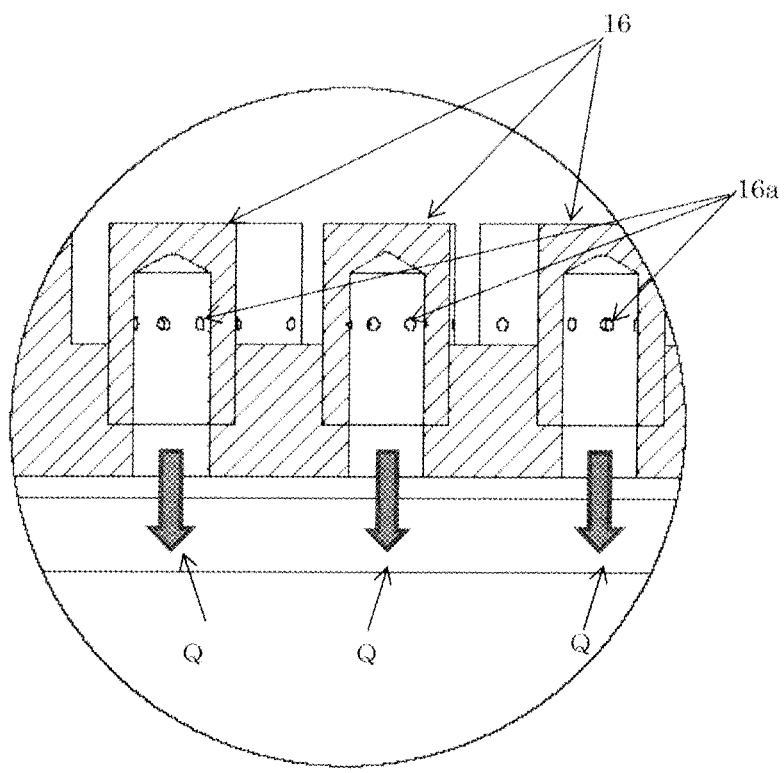
FIG. 4 is a diagram illustrating the form of one liquid collision nozzle 16 illustrated in FIGS. 3A and 3B.

Further, FIG. 4 is an enlarged view of a portion of the nozzle header 5, illustrated in FIG. 3A, on which portion the liquid collision nozzle 16 is arranged. As illustrated in FIG. 4, the shape of the single liquid collision nozzle 16 is such that a small hole 16a opens toward the center thereof. Liquid injected through this small hole 16a is made to collide at the center part of the liquid collision nozzle 16 to generate micro-nano bubbles, which is then spewed in the direction indicated by the arrow Q. As a result of an experiment, it is found that controlling the velocity (V) of the liquid increases the amount of micro-nano bubble generated and prolongs the bubble lifetime. When the velocity (V), is in excess of 25 m/s as a guideline, the nozzle becomes a stable micro-nano bubble generation nozzle.

Figure 5:
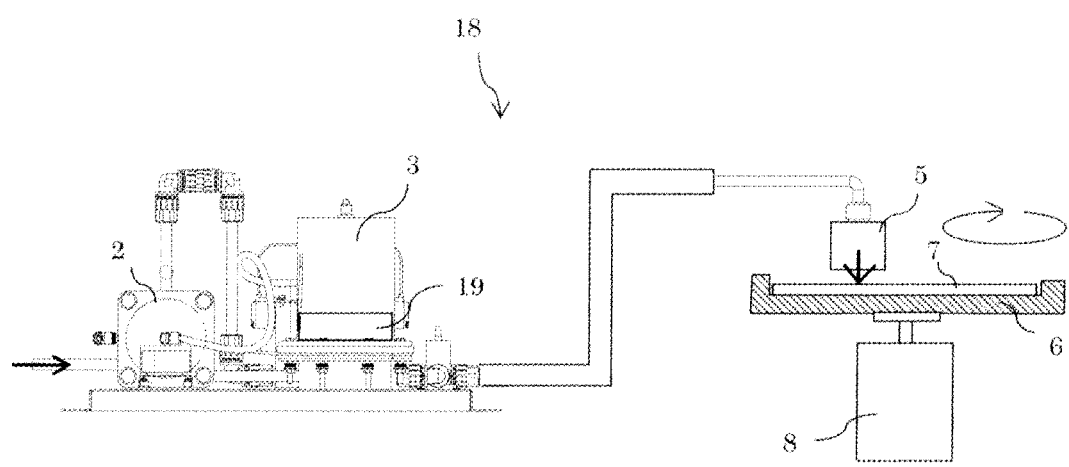
FIG. 5 illustrates an example of modification of the heating means in the cleaning device of the present invention that uses the micro-nano bubbles.

FIG. 5 illustrates an example of a modified heating means in the cleaning device using the micro-nano bubble of the present invention. In a cleaning device 18, the heating device 4 illustrated in FIG. 1 is not arranged on the downstream of the gas-liquid mixing tank 3; instead, a heater 19 is disposed on the bottom of the gas-liquid mixing tank 3 as a heating means. This configuration is different from the cleaning device 1 illustrated in FIG. 1 in that the heating means is arranged downstream of the gas-liquid mixing tank 3. Position where the heater 19 is to be arranged is not limited to the bottom of the gas-liquid mixing tank 3 but may be provided on the side of the gas-liquid mixing tank 3. In addition, it is also practicable to provide both the bottom and sides of the gas-liquid mixing tank 3.

Figure 6:
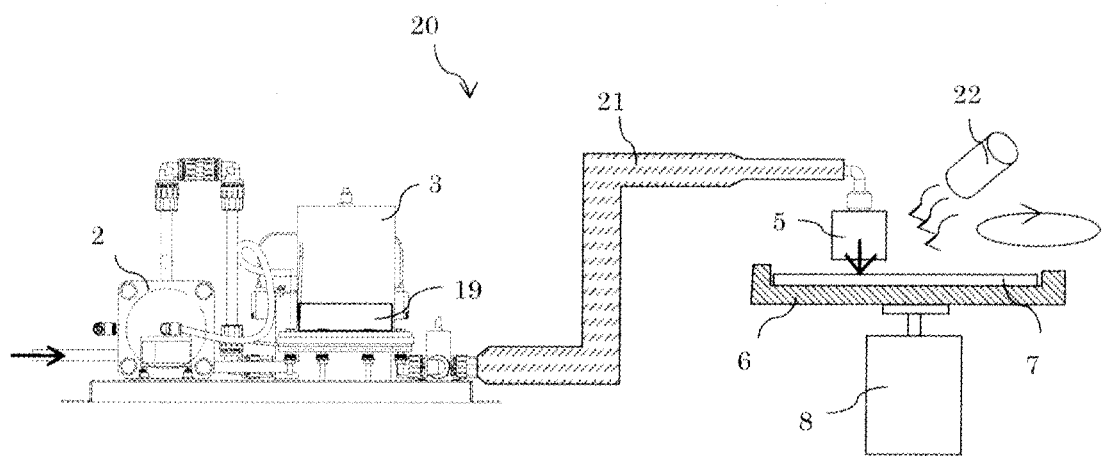
FIG. 6 illustrates an example of another modification of the heating means in the cleaning device of the present invention that uses the micro-nano bubbles.

FIG. 6 illustrates another example of a modified heating means in the cleaning device using the micro-nano bubble of the present invention. A cleaning device 20 illustrated in FIG. 6 has piping that connects the gas-liquid mixing tank 3 and the nozzle header 5 and the piping is heated with a ribbon heater 21; in addition, the nozzle header 5 is heated with a warm-air generator 22. Employing this configuration also allows setting the temperature of the treatment solution within the predetermined temperature range. Though the device illustrated in FIG. 6 has both the ribbon heater 21 and the warm-air heater 22, using any one of such heaters works.

Figure 7:
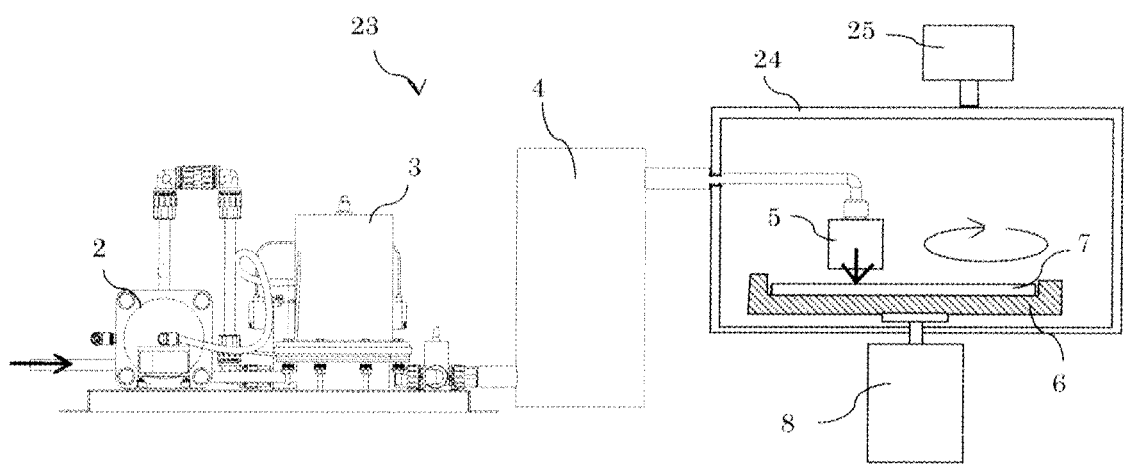
FIG. 7 illustrates an example of further another modification of the heating means in the cleaning device of the present invention that uses the micro-nano bubbles.

FIG. 7 illustrates further another example of a modified heating means in the cleaning device using the micro-nano bubble of the present invention. A cleaning device 23 illustrated in FIG. 7 has a compartment 24 of one compartment in addition to the cleaning device illustrated in FIG. 1, and the compartment houses the nozzle header 5 and the holder 6. Further, the cleaning device 23 has an air conditioner 25 to control the inside temperature of a compartment 24 within 30 to 90° C. The cleaning device illustrated in FIG. 7 allows regulating the temperature of the treatment solution easily and has an advantage of controlling the temperature being uniform.

Figure 8:
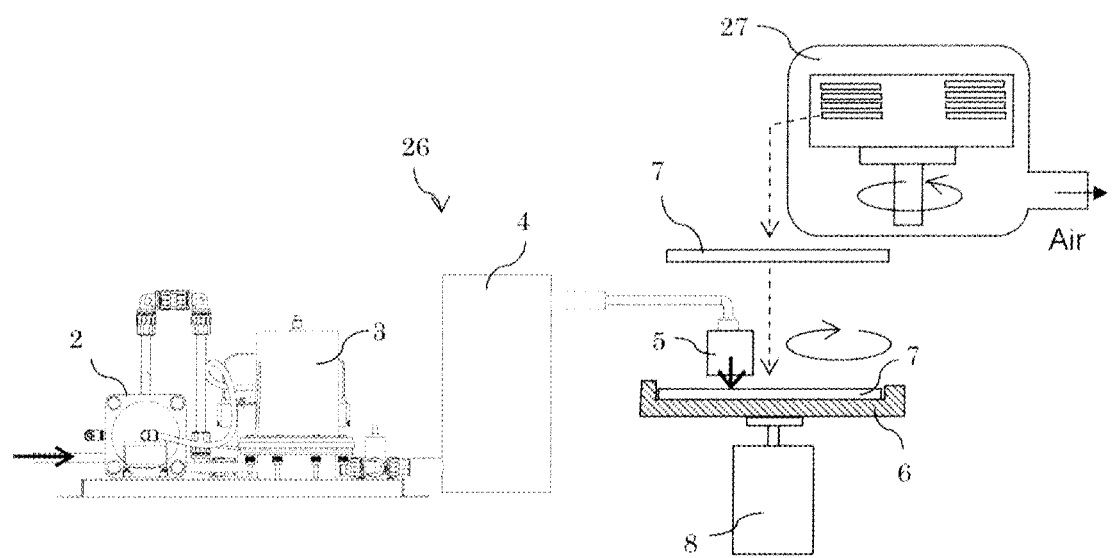
FIG. 8 illustrates an example of equipment configuration in the cleaning device of the present invention that uses the micro-nano bubbles, in which the example equipment is provided with a drying means for a workpiece substrate.

FIG. 8 illustrates an example of a cleaning device using micro-nano bubbles of the present invention that has a drying means for the workpiece substrate. A cleaning device 26 illustrated in FIG. 8 has a drying means 27 in addition to the cleaning device illustrated in FIG. 1; the drying means 27 is for drying water droplet or moisture remaining on the workpiece substrate such as a semiconductor wafer. The spin dryer, the isopropanol (IPA) vapor drying apparatus, and the spin-etcher are usable as the drying means 27 as stated above; FIG. 8 illustrates the spin dryer as an example. In the cleaning device 26, the workpiece substrate 7 such as a wafer is inserted firstly in the drying means 27 and undergoes drying with the suction-drying by the centrifugal force, which sucks ambient air. Then, the workpiece substrate 7 after the drying is taken out in a manner as the dotted-arrow indicates and is held on the holder 6. The treatment solution that contains gaseous micro-nano bubbles is sprayed in the direction indicated by the downward arrow in the figure from the nozzle header 5 that has a spraying nozzle, which is not illustrated, to the rotating workpiece substrate 7.

Figure 9:
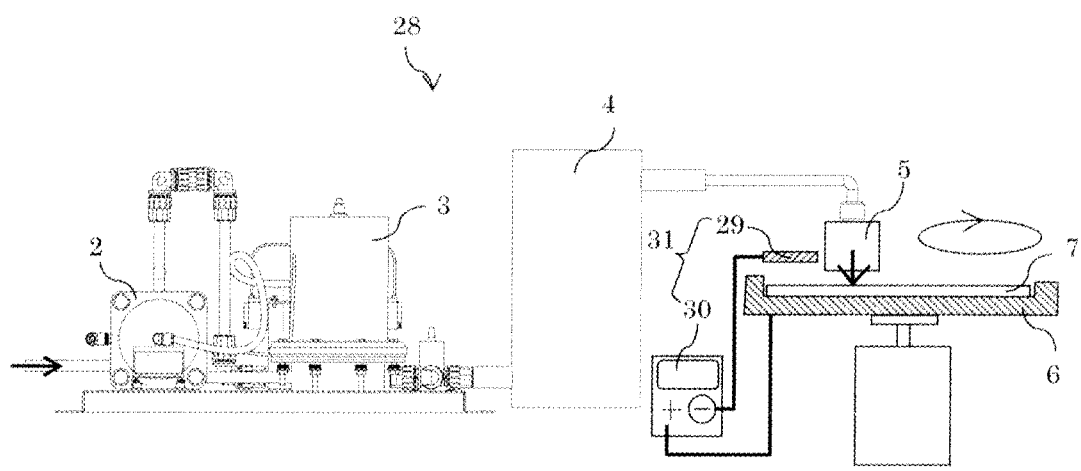
FIG. 9 illustrates an example of equipment configuration in the cleaning device of the present invention that uses the micro-nano bubbles, in which the example equipment is provided with a voltage applying unit for the workpiece substrate.

FIG. 9 illustrates an example of a cleaning device using micro-nano bubbles of the present invention that has a voltage applying means 31 for applying voltage on a workpiece substrate. The voltage applying means 31 is comprised basically of an electrode 29 arranged close to the nozzle header 5 that sprays the treatment solution, a power supply 30, and electrical wiring that connects the electrode 29 and the holder 6, which supports the workpiece substrate 7, to the power supply 30. These are the devices and parts that are to be added to the cleaning device illustrated in FIG. 1. In a cleaning device 28 illustrated in FIG. 9, the electrode 29 and the holder 6 are electrically connected to the positive (+) side and the negative (−) side of the power supply 30 respectively. The treatment solution containing gaseous micro-nano bubbles is sprayed to the workpiece substrate 7 in the direction indicated by the downward arrow in the figure, applying the voltage by the power supply 30, for peeling off residual resist films from the workpiece substrate or for removing contaminants of metal or metal compound from the workpiece substrate. The range of the voltage to be applied by a power supply 30 is not particularly limited. However, applying DC voltage of 10 to 100 V or pulse voltage of 10 to 50 kHz of 10 to 100 V would be practical. In the present invention, use of pulse voltage is preferable compared to use of DC voltage.

The cleaning devices illustrated in FIGS. 1 and 5 to 7 can be constructed in a simple and compact configuration by adding, to a conventional micro-nano bubble generator, a device for heating the micro-nano bubbles of gas, a nozzle header having a spraying nozzle for spraying the treatment solution to the workpiece substrate, and a holder for supporting the workpiece substrate. In addition, the cleaning device illustrated in FIG. 8 and FIG. 9 can be constructed by attaching a means for drying the workpiece substrate or a means for applying voltage to each of the cleaning devices illustrated in FIG. 1 and FIGS. 5 to 7; and this allows the device so-constructed to be a device suitable for shortening the cleaning time and enhancing the cleaning efficiency.

EMBODIMENT

The following describes concretely embodiments of the present invention. However the described embodiment in no way limits the scope of the present invention.

Embodiment 1

Air nano bubble water was produced according to the method disclosed in the Patent Literature 4 using the nano bubble water producing device Model ΣPM-5 (a bellows pump type, a product of Sigma Technology Co., Ltd.), and used as a measurement specimen after dilution with pure water by a factor of 100. Further, pure water before producing nano bubbles was used as a reference specimen. The pure water before producing nano bubbles is equivalent to water that does not contain nano bubbles.

An amorphous-ice-embedded specimen for the observation was prepared by quick-freezing the air nano bubble water immediately after production; the quick-freezing was performed using the specimen quick-freezing device Vitrobot Mark IV (a product of FEI Co.). The specimen thickness was 200 nm. On the other hand, a reference specimen was prepared using water that does not contain nano-bubbles (pure water) by quick-freezing using the same quick-freezing device. The specimen thickness was 200 nm. The amorphous-ice-embedded nano bubbles were directly observed at a specimen temperature of approximately 80° K under a cryo-transmission electron microscope Titan Krios (a product of FEI Co.) having electron energy of 300 keV. The electron beam used in the observation was approximately 20 electron/Å$^2$ by virtue of the Low Dose technology, causing little temperature rise in the specimen during photographing.

Figure 10:
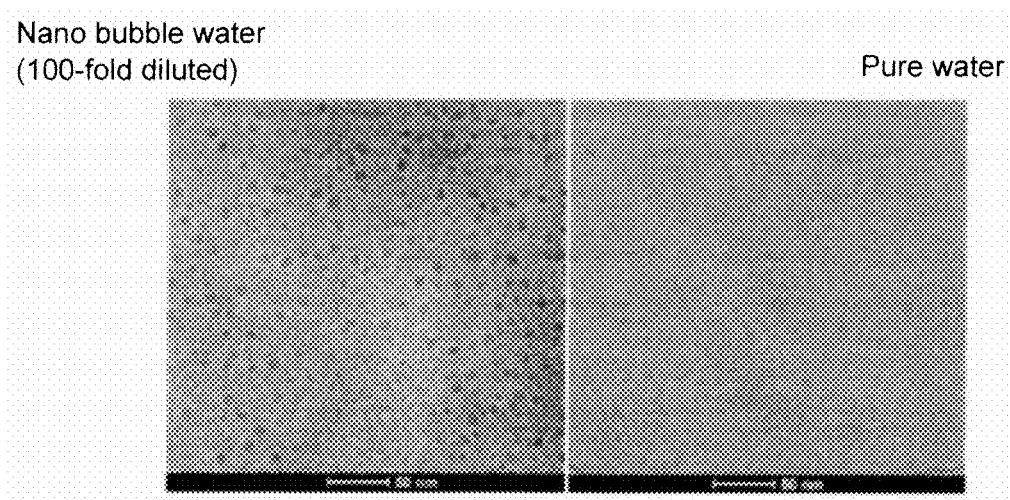
FIG. 10 shows electron microscopic photograph images of the amorphous ices of water that contains nano bubbles of air and water that contains no bubbles both in Embodiment 1, and shows the bar chart that indicates the particle size distribution of such nano bubbles.
Figure 10:
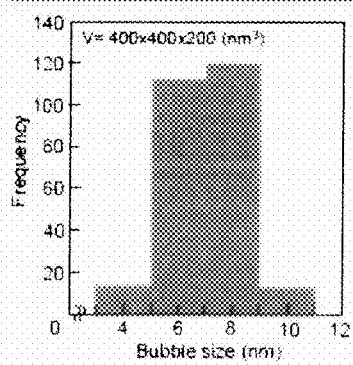

FIG. 10 shows photographs of electron microscopic image of amorphous ice of frozen pure water that contains air nano bubbles, and amorphous ice of frozen pure water (water without nano bubbles). As for the air nano bubble water, the particle size distribution (a histogram to show the particle size variance) is displayed under the electron microscope photograph.

Photograph of electron microscopic image displayed on the left side of FIG. 10 shows the air nano bubbles observed immediately after the preparation by ΣPM-5. The tone-contrastive circular portions observed in the photograph are nano bubbles. Image processing found that the mean particle size was 7 nm. The volume of the amorphous ice observed for the determination of the particle size distribution was $3.2 \times 10^{-14}$ cc (400 nm×400 nm×200 nm thick.); that is, about 260 bubbles were contained in that volume of ice. Since the 100-fold-diluted nano bubble water was observed, the concentration of air nano bubbles of the nano bubble water is assessed to be $8.1 \times 10^{17}$ bubble/cc (ml) (810 quadrillion bubble/cc (mL)). In contrast, the photograph of electron microscopic image displayed on the right side of FIG. 10 is an image of amorphous ice, wherein the tone-contrastive portion is not observed; this allows confirming that the water does not contain bubbles. Thus, with the measurement method and measuring instrument according to the present invention, not only the presence of nano bubbles contained in water can be confirmed as a direct image, but also the information on nano bubbles in terms of the particle size, the particle number, the particle size distribution, and the particle form can be obtained.

Using pure water containing air nano bubbles displayed on the left side of FIG. 10, residual resist films on a semiconductor substrate was cleaned using the cleaning device illustrated in FIG. 1. The temperature of the pure water containing air nano bubbles was raised to about 85° C., using the heating device 4 that is able to heat instantly. Thereby, the temperature of the pure water containing air nano bubbles that passes the nozzle header 5 was regulated to 70 to 75° C. Since it is not practical to set the temperature of pure water containing air nano bubbles strictly to one temperature when considering mass productivity, the minimum temperature in the temperature adjustment may be regarded as the heating temperature that is specified for the treatment solution in the present invention. The cleaning is performed generating the micro-nano bubbles by spraying the heating treated air-dissolved pure water from the nozzle header 5. At this time, the semiconductor substrate, the object of the cleaning, underwent the cleaning rotating the holder 6. As a result, it was found that a micro-nano bubble generator that generated the bubbles of room temperature consumed 30 minutes to completely peel off the residual resist films; in contrast, the using of micro-nano bubbles of high-temperature of 70 to 75° C. completed the cleaning in 15 minutes or less, which is about half.

In addition, when the cleaning is performed in the same manner stated above using oxygen nano bubbles as the cleaning treatment solution employing oxygen instead of air as the gas to be dissolved in pure water, the time consumed to completely peel off the residual resist films was 10 minutes; it was therefore confirmed that the use of oxygen was able to shorten the cleaning time down to ⅓.

Embodiment 2

An ozone nano bubble water was prepared according to the method disclosed in Patent Literature 4 stated above using the nano bubble producing device Model ΣPM-5 (a product of Sigma Technology Co., Ltd., a bellows pump type). The ozone nano bubble water, which passed about half a month after the preparation, was diluted 100-fold with pure water, and used as the measurement specimen. The specimen thickness was 200 nm. After quick-freezing this specimen with the same quick-freezing device in Embodiment 1, the nano bubbles embedded in the amorphous ice were directly observed under the same cryo-transmission electron microscope as in Embodiment 1 at the specimen temperature of about 80° K. The electron beam used in the observation was approximately 20 electron/Å$^2$ by virtue of the Low Dose technology causing little temperature rise in the specimen.

Figure 11:
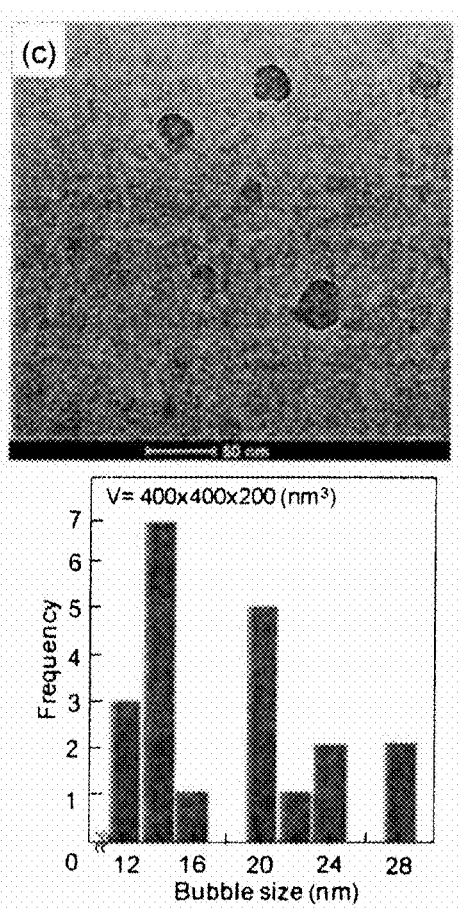
FIG. 11 shows electron microscopic photograph images of the amorphous ice of water that contains nano bubbles of ozone in Embodiment 2, and shows the bar chart that indicates the particle size distribution of such nano bubbles.

FIG. 11 shows a photograph of electron microscopic image of that specimen and the particle size distribution (a histogram to show the particle size variance), which is displayed below the photograph. The image shown in FIG. 11 is an observed ozone nano bubbles which passed about half a month after the preparation by ΣPM-5. The mean particle size of bubbles is 18 nm, which is a little bit larger than that of the air nano bubbles shown in the FIG. 10. This may be interpreted that coarsening has occurred due to aggregation. The volume of the amorphous ice observed for the determination of the particle size distribution was $3.2 \times 10^{-14}$ cc (400 nm×400 nm×200 nm thick.); that is, about 21 bubbles were contained in that volume of ice. Since the 100-fold-diluted nano bubble water was observed, the concentration of ozone nano bubbles of this nano bubble water was assessed to be $8.6 \times 10^{16}$ bubble/cc (ml) (90 quadrillion bubble/cc (mL)).

Using pure water containing ozone nano bubbles shown in FIG. 11, four sheets of semiconductor substrates having contaminant of metal or metal compound thereon were cleaned with the cleaning device illustrated in FIG. 1. The temperature of the pure water containing ozone nano bubbles was raised to about 85° C., using a heating treatment device 4 that was able to heat instantly. Thereby, the temperature of the pure water containing ozone nano bubbles that passes the nozzle header 5 was regulated to 70 to 75° C. The cleaning is performed generating the micro-nano bubbles by spraying the heating treated ozone-dissolved pure water from the nozzle header 5. At this time, the semiconductor substrates, the object of the cleaning, underwent the cleaning rotating the holder 6. The cleaning time was five minutes. The contaminants on the semiconductor substrate were analyzed by the elemental analysis (EDX measurement) using a scanning electron microscope. The result of quantitative analysis of elements on the semiconductor substrate is shown in Table 1 below. The unit of each element is ($\times 10^{10}$ atom/cm$^2$).

TABLE 1

| Wafer No. | Before or After Cleaning | K-Ka | Ca-Ka | Ti-Ka | Cr-Ka | Fe-Ka | Ni-Ka | Cu-Ka | Zn-Ka |
|---|---|---|---|---|---|---|---|---|---|
| Wafer 1 | Before | 136.7 | 367.67 | 3.26 | 0 | 2.72 | 0.13 | 3.1 | 8.72 |
|  | After | 0 | 1.03 | 2.79 | 0 | 1.74 | 0 | 2.84 | 1.11 |
| Wafer 2 | Before | 114.3 | 25.16 | 1.64 | 0.32 | 14.53 | 0.03 | 1.94 | 16.54 |
|  | After | 0 | 0.48 | 1.46 | 0.22 | 4.57 | 0 | 1.87 | 0.97 |
| Wafer 3 | Before | 93.38 | 24.65 | 1.49 | 0.08 | 45.68 | 0.14 | 1.26 | 14.62 |
|  | After | 0 | 0 | 0.62 | 0 | 1.52 | 0 | 1.64 | 0.41 |
| Wafer 4 | Before | 196.42 | 132.15 | 12.85 | 0.94 | 11.14 | 1.04 | 1.25 | 10.65 |
|  | After | 0 | 0.47 | 1.98 | 0.08 | 1.95 | 0 | 0.69 | 0.16 |

As shown in Table 1, it was confirmed that the use of high temperature pure water containing ozone nano bubbles as a treatment solution was able to clean almost completely the contaminant of metal or metal compound on the semiconductor wafer substrate efficiently in a short time.

Using pure water containing ozone nano bubbles of this embodiment, residual resist films on the semiconductor wafer was cleaned with the cleaning device illustrated in FIG. 1 in the same manner as in Embodiment 1. The temperature of the pure water containing ozone nano bubbles was raised to about 80° C., using a heating treatment device 4 that was able to heat instantly. Thereby, the temperature of the pure water containing ozone nano bubbles that passes the nozzle header 5 was regulated to 65 to 70° C. The cleaning is performed generating the micro-nano bubbles by spraying the heating treated ozone-dissolved pure water from the nozzle header 5. At this time, the semiconductor wafer, the object of the cleaning, underwent the cleaning rotating the holder 6. As a result, it was found that the cleaning time of 20 minutes, which was needed by the pure water containing ozone nano bubbles produced by the micro-nano bubble generator that generates the bubbles of room temperature for the complete peeling off of the residual resist films, was allowed to reduce to within three minutes.

Embodiment 3

Besides the ozone-containing nano bubbles, pure water containing carbon dioxide gas (carbon-rich gas) was used as the treatment solution. Using a semiconductor wafer, as a workpiece substrate, having the same size as Embodiment 2, the cleaning of the residual resist films on the semiconductor wafer substrate was performed with the cleaning device illustrated in FIG. 1 in the same manner as Example 2. The pure water, which contains nano bubbles, used in this embodiment was prepared in the process described below. In the dissolved gas enriching process, ozone generated by an ozone generator and carbon dioxide gas (its volume is about ⅕ of the ozone volume) were introduced so as to make pure water have the dissolved ozone concentration of 200 ppm or more; then so prepared nano bubble containing pure water was put in the nano bubble water producing device ΣPM-5 to produce pure water containing nano bubbles. After standing the treatment solution thus prepared for several days, the nano bubbles containing ozone and carbon oxide gas was determined in the same manner as in Embodiment 1. As a result of the examination, it was confirmed that the mean particle size was 30 nm or less and the density per 1 mL of the treatment solution was $10^{16}$ bubble/cc (mL) or more. Since this treatment solution was allowed to stand days shorter than that of Embodiment 2, the treatment solution had the nano bubbles particles finer particle size compared to the results shown in FIG. 11, and the density of nano bubble particles tended to become higher.

The treatment solution thus prepared was used in the cleaning in a manner as follows. The temperature of the treatment solution thus prepared was raised to about 80° C. using the heating treatment device 4 that is able to heat instantly, thereby, the temperature of the pure water containing nano bubbles of ozone and carbon dioxide gas, which is to pass the nozzle header 5, was regulated to be 65 to 70° C., and then that pure water was sprayed from the nozzle header 5 to generate the micro-nano bubbles and perform cleaning. At this time, the semiconductor substrate, the object of the cleaning, underwent the cleaning rotating the holder 6. As a result, it was found that the use of pure water containing ozone nano bubbles (Embodiment 2) consumed three minutes or less to completely peel off the residual resist films under the temperature condition of 65 to 70° C.; in contrast, in this embodiment, the use of the micro-nano bubbles of ozone and carbon dioxide was able to complete the cleaning in shorter time of two minutes or less under the same temperature condition.

Embodiment 4

Cleaning of the residual resist films on the semiconductor wafer was performed in the same manner as Embodiment 2. However, the conditions were different in that the treatment solution used was the solution containing nano bubbles of ozone prepared in Embodiment 2, that the workpiece substrate was the semiconductor wafer of the same size as Embodiment 2, that the cleaning device illustrated in FIG. 8 was used, and that the temperature condition of the treatment solution was 50 to 55° C. instead of 65 to 70° C. A cassette type spin dryer was used as the drying means 27 illustrated in FIG. 8. After loading the semiconductor wafer, the workpiece substrate 7, drying was performed for five minutes using the suction-drying by the centrifugal force, which sucks ambient air. Then, the workpiece substrate 7 (semiconductor wafer) after drying was taken out and mounted on the holder 6, which had a rotating mechanism, as illustrated with the dot line in the figure. The cleaning was then performed by spraying the treatment solution, which contains ozone micro-nano bubbles, from the nozzle header generating micro-nano bubbles in the direction indicated by the downward arrow in the figure with the workpiece substrate being rotated by the holder 6. The treatment solution containing ozone nano bubbles was heated to about 60° C. using the heating treatment device 4 that is able to heat instantly. Thereby, the temperature of the treatment solution that passes the nozzle header 5 was regulated to 50 to 55° C.

In this embodiment, the cleaning of the residual films adhered on the semiconductor wafer was performed in the same cleaning conditions using a semiconductor wafer that had not undergone drying pretreatment to examine the difference in cleaning effect due to with or without the drying process of the workpiece substrate 7. The temperature of the treatment solution was regulated to 50 to 55° C., which was the same temperature as the case that the cleaning was to be performed after drying process.

As a result, in the case that the treatment solution prepared from pure water containing ozone nano bubbles is used and the workpiece substrate 7 was not dried, the time needed by the complete peeling off of the residual resist films was 10 minutes or less. In contrast, the peeling-off time was within seven minutes if the workpiece substrate 7 was dried with the drying means 27; therefore, it was found that it was possible to shorten the cleaning time.

As stated above, the employing of a drying process for the workpiece substrate 7 allows shortening the cleaning time. In the present invention, it may be practicable to simplify the drying process of the workpiece substrate 7 by using for example the cleaning device illustrated in FIG. 6 other than the drying means 27 illustrated in FIG. 8. When the cleaning device 20 illustrated in FIG. 6 is to be used, water droplet or moisture is removed by centrifugal force of the rotation of the non-dried workpiece substrate held on the holder 6 before spraying the micro-nano ozone-bubbles. In this removal process, dry air or hot air may be blown to the workpiece substrate from the warm-air generator 22 for more reliable removal of water droplets and moisture. After that, the treatment solution, which contains micro-nano bubbles of ozone heated to 30 to 90° C. preferably 50 to 85° C., is sprayed to the surface of the workpiece substrate 7 regulating the number of rotations of the holder 6. Thereby, the residual resist films are completely peeled off.

Embodiment 5

A semiconductor wafer of the same size as Embodiment 2 as the workpiece substrate was put in the cleaning device having the ultrasonic generator 8 illustrated in FIG. 1 using the treatment solution of pure water containing ozone nano bubbles prepared in Embodiment 2. Then, cleaning of the residual resist films on the semiconductor wafer was performed in the same manner as Embodiment 2 except that the temperature condition of the treatment solution was 50 to 55° C. instead of 65 to 70° C. This embodiment is different from the cleaning method in Embodiment 2 in that the treatment solution that contains ozone nano bubbles is sprayed to the workpiece substrate 7 giving ultrasonic vibration by the ultrasonic generator 8 to the workpiece substrate 7. The frequency of the ultrasonic vibration was 50 kHz.

As a result, the time needed in this embodiment for the complete peeling off of the residual resist films was five minutes or less. This cleaning time is shorter than being within 10 minutes that was exhibited in Embodiment 4 in which the ultrasonic vibration was not applied (the workpiece substrate 7 did not undergo drying pretreatment). Thus, the applying of the ultrasonic vibration to the workpiece substrate 7 in cleaning process allowed the cleaning time to shorten in half.

Embodiment 6

A semiconductor wafer of the same size as Embodiment 2 as the workpiece substrate was put in the cleaning device illustrated in FIG. 9 using the treatment solution of pure water containing ozone nano bubbles prepared in Embodiment 2. Then, cleaning of the residual resist films on the semiconductor wafer was performed in the same manner as Embodiment 2 except that the temperature condition of the treatment solution was 50 to 55° C. instead of 65 to 70° C. This embodiment is different from the cleaning method in Embodiment 2 in that, in cleaning the workpiece substrate 7, the treatment solution containing ozone nano bubbles is sprayed applying voltage on the workpiece substrate 7 by the voltage applying means 31. In the cleaning device illustrated in FIG. 9, the cleaning was performed applying the pulse voltage of which voltage and frequency were set to 32 V and 20 kHz respectively using an inductive pulse power supply as the power supply 30, wherein the electrode 29 arranged close to the nozzle header and the holder 6 are electrically connected to the positive (+) side and the negative (−) side of the power supply 30 respectively.

As a result, the time needed for complete peeling off the residual resist films was within three minutes. This cleaning time is shorter than being within 10 minutes that was exhibited in Embodiment 4 in which the ultrasonic vibration was not applied (the workpiece substrate 7 did not undergo drying pretreatment); and thus, applying voltage while cleaning the workpiece substrate 7 allowed the cleaning time to reduce about ⅓.

The voltage applying method employed in this embodiment may be used in combination with at least any one of the methods described previously: that is, the method that dries the non-processed substrate in advance and the method that applies ultrasonic vibration thereto. Thereby, it is possible to shorten the cleaning time further.

As described above, the cleaning method according to the present invention is able to peel off the residual resist films or to remove contaminants of metal or metal compound on a substrate efficiently and reliably in a shorter time than the conventional method, while reducing the environmental load. In addition, the cleaning device of the present invention allows constructing a cleaning device of simple and compact configuration by combining the conventional micro-nano bubble generator with the device for heating the micro-nano bubbles of air, the nozzle header having the injection nozzle for spraying the treatment solution containing micro-nano bubbles to the workpiece substrate, and the holder for holding the workpiece substrate. In addition further, the cleaning effect will be enhanced more by drying the workpiece substrate, or applying ultrasonic vibration or voltage when the treatment solution of micro-nano bubbles of gas is sprayed.

INDUSTRIAL APPLICABILITY

The method of cleaning by the present invention is applicable not only to a glass substrate or a semiconductor wafer substrate, but also to other fields, for example, metal cleaning in metal processing, cleaning of agricultural products, and cleaning of soil; therefore its usefulness is very broad.

The invention claimed is:

1. A cleaning method that uses micro-nano bubbles for peeling off resist film or removing contaminants of metal or metal compound on a work piece substrate by spraying a treatment solution against the work piece substrate, wherein the treatment solution contains gaseous micro-nano bubbles having a mean particle size of 30 nm or less and density thereof being $10^{16}$ bubbles or more per 1 mL when determined by a measurement with a cryo-transmission electron microscopy using an ice embedding method, and wherein the treatment solution is maintained at a temperature of 30 to 90° C.

2. The cleaning method that uses micro-nano bubbles according to claim 1, wherein the treatment solution containing gaseous micro-nano bubbles is a treatment solution that contains gaseous micro-nano bubbles produced by collision of jets of a solution containing dissolved-gas, wherein the collision is made to occur at the center of a cylinder by injecting the solution containing dissolved-gas from the outside of the cylinder having two or more small through-holes arranged in the circumferential direction of the cylinder so as to jet the injected solution from openings of the small through-holes in the cylinder at a pressure higher than the atmospheric pressure, wherein the openings of the small through-holes are arranged facing each other on the same plane parallel to the radial cross section of the cylinder in order that a water hammer of the jets concentrate at the center of the cylinder by making the collision to occur among jets from each of the openings.

3. The cleaning method that uses micro-nano bubbles according to claim 1, wherein a gas is a gas selected from the group consisting of ozone and oxygen; and the treatment solution is pure water containing micro-nano bubbles of the gas selected from the group consisting of ozone and oxygen.

4. The cleaning method that uses micro-nano bubbles according to claim 1, wherein a gas is a gas that includes at least one of gases selected from the group consisting of carbon dioxide and hydrogen peroxide in addition to ozone or oxygen.

5. The cleaning method that uses micro-nano bubbles according to claim 1, wherein water droplets and moisture on the workpiece substrate are dried before spraying the treatment solution.

6. The cleaning method that uses micro-nano bubbles according to claim 1, wherein the treatment solution that contains gaseous micro-nano bubbles is sprayed against the work piece substrate as a cleaning object applying ultrasonic vibration thereon.

7. The cleaning method that uses micro-nano bubbles according to claim 1, wherein a voltage is applied between the workpiece substrate and an electrode disposed close to a nozzle header that sprays the treatment solution.

8. The cleaning method that uses micro-nano bubbles according to claim 1, wherein the temperature of the treatment solution is 50° C. or higher but 85° C. or lower.

* * * * *